United States Patent
Bartos et al.

(10) Patent No.: US 10,222,431 B2
(45) Date of Patent: Mar. 5, 2019

(54) MEASURING DEVICE WITH PRE-MAGNETIZING MAGNET

(71) Applicant: TE Connectivity Sensors Germany GmbH, Dortmund (DE)

(72) Inventors: Axel Bartos, Waltrop (DE); Armin Meisenberg, Dortmund (DE)

(73) Assignee: TE Connectivity Sensors Germany GmbH, Dortmund (DE)

( * ) Notice: Subject to any disclaimer, the term of this patent is extended or adjusted under 35 U.S.C. 154(b) by 0 days.

(21) Appl. No.: 15/685,487

(22) Filed: Aug. 24, 2017

(65) Prior Publication Data

US 2017/0350948 A1    Dec. 7, 2017

Related U.S. Application Data

(63) Continuation of application No. PCT/EP2016/000315, filed on Feb. 24, 2016.

(30) Foreign Application Priority Data

Feb. 24, 2015   (DE) .................. 10 2015 002 219

(51) Int. Cl.
  *G01R 33/09*   (2006.01)
  *G07D 7/04*   (2016.01)
  *H01F 7/02*   (2006.01)

(52) U.S. Cl.
  CPC .............. *G01R 33/09* (2013.01); *G07D 7/04* (2013.01); *H01F 7/0205* (2013.01); *H01F 7/0294* (2013.01)

(58) Field of Classification Search
  CPC ...... G01R 33/09; G07D 7/04; G07D 2207/00; H01F 7/0205
  See application file for complete search history.

(56) References Cited

U.S. PATENT DOCUMENTS

| 4,536,230 | A | * | 8/1985 | Landa ..................... H01F 7/021 148/300 |
| 6,310,475 | B1 | | 10/2001 | Kawase et al. |
| 8,544,630 | B2 | * | 10/2013 | Schutzmann ............ G07D 7/04 194/214 |
| 8,803,518 | B2 | | 8/2014 | Meisenberg et al. |
| 2006/0279280 | A1 | | 12/2006 | Minamitani et al. |
| 2014/0312894 | A1 | | 10/2014 | Bartos et al. |
| 2015/0302676 | A1 | * | 10/2015 | Mengel .................... G07D 7/04 382/135 |
| 2017/0154487 | A1 | * | 6/2017 | Asano ...................... G07D 7/04 |

FOREIGN PATENT DOCUMENTS

DE     1696245 A1   1/1972

OTHER PUBLICATIONS

PCT Search Report, dated Jun. 29, 2016, 15 pages, PCT/EP2016/000315.

* cited by examiner

*Primary Examiner* — Mark J Beauchaine
(74) *Attorney, Agent, or Firm* — Barley Snyder

(57) ABSTRACT

A measuring device according to the invention comprises a sensor line and a pre-magnetizing magnet. The sensor line has at least one sensor and extends in a line direction. The pre-magnetizing magnet has a non-homogeneous magnetization.

7 Claims, 15 Drawing Sheets

MEASURING DEVICE WITH PRE-MAGNETIZING MAGNET

CROSS-REFERENCE TO RELATED APPLICATIONS

This application is a continuation of PCT International Application No. PCT/EP2016/000315, filed on Feb. 24, 2016, which claims priority under 35 U.S.C. § 119 to German Patent Application No. 102015002219.9, filed on Feb. 24, 2015.

FIELD OF THE INVENTION

The present invention relates to a measuring device and, more particularly, to a measuring device having a pre-magnetizing magnet for measuring magnetic properties.

BACKGROUND

Documents of value, such as bank notes or checks, often have magnetic security features. The magnetic security features can be hard features formed from magnetically hard substances having a high level of magnetic remanence and a high coercive field strength. The magnetic security features can also be soft features formed from magnetically soft substances having a high level of remanence but a low coercive field strength.

Magnetically soft substances are easily magnetized in a magnetic field. The magnetization of a magnetically soft substance can, for example, be produced by an electric current in a coil or by the presence of a permanent magnet. Magnetization in this manner produces a magnetic flux density in the magnetically soft substance which is many times higher than a magnetic flux density produced in air by the same magnetic field. Magnetically soft substances generally have a coercive field strength less than 1000 A/m. Magnetically soft substances can, however, have saturation magnetization values which are comparable with magnetically hard substances so that, in the saturated state, they cannot be distinguished from magnetically hard materials.

Magnetically hard materials are magnetized before use and a magnetic field is derived from magnetically hard security features without the presence of an external magnetic field. This magnetic field remains in existence for a relatively long time. However, over time, the magnetically hard materials are susceptible of becoming demagnetized. For example, during handling, bank notes are often subjected to impacts or are creased which may result in a demagnetization. It is, therefore, known to use a pre-magnetizing magnet to allow the magnetically hard security feature to retain magnetization over a longer time period.

Ferromagnetic security threads used on bank notes are disclosed in DE 1696245. Ferromagnetic materials used to form the security thread can have either a small coercive field strength or a large coercive field strength. Measuring devices for testing such bank notes identify both security threads made of a material having a small coercive field strength and security threads made of a material having a large coercive field strength.

A measuring device for measuring magnetic properties is disclosed in WO 2010/006801. The measuring device has a sensor cell comprising at least two magnetoresistive sensors which are arranged along a line direction and a support field device which produces a magnetic support field. The support field device has a magnetic field component pointing in the line direction and a field strength varying in the line direction. The measuring device has a pre-magnetizing magnet disposed upstream with respect to the sensor line. The pre-magnetizing magnet first magnetizes a measurement object with a magnetic pattern and the measurement device is subsequently guided over the sensor line to identify the magnetic pattern of the measurement object.

In an embodiment of the measuring device disclosed in WO 2010/006801, two sensor lines may be arranged one after the other in a reading direction of a plurality of measurement objects. The sensor lines are used to detect different magnetic patterns. However, the sensor line which identifies a magnetically hard pattern must not have a pre-magnetizing field during the measurement, while in order to identify the magnetically soft patterns, a powerful pre-magnetizing field for the sensor line identifying a magnetically soft pattern is necessary. The pre-magnetizing field acts in the region of a first sensor line and magnetizes hard and soft magnetic features, allowing the identification of the magnetically soft and hard patterns. If the bank note is subsequently guided over a second sensor line, in the region of which the pre-magnetizing field no longer acts, this second sensor line can separately identify the purely magnetically hard pattern.

Another measuring device for measuring magnetic properties is disclosed in EP 0977015. The measuring device has a measuring element, a support field magnet, and a pre-magnetizing magnet. Magnetic material on a document of value has to be magnetized before it is identified.

In the prior art, documents of value have a plurality of magnetically hard security features in which one magnetically hard security feature comprises a first magnetic material having a first coercive field strength and a second security feature comprises a second magnetic material having a second coercive field strength. Some known documents of value have combined security features produced by arranging a material with a high coercive field strength adjacent a material with a low coercive field strength.

The presence of the combined security features can be established in such documents of value with a plurality of measuring devices each having a plurality of sensor lines and a plurality of pre-magnetizing magnets in a travel direction of the document of value. All the security features are pre-magnetized in the same direction with a first pre-magnetizing magnet of a first measuring device. As a result, it is possible to initially establish with a first sensor line of the first measuring device whether the document of value has the requisite number of security features. If the document of value is then pre-magnetized with a second pre-magnetizing magnet of a second measuring device, which produces a weaker field than the first pre-magnetizing magnet so that the security feature with the weakly coercive material is magnetized in the opposite direction, it can be determined in a subsequent sensor line which security features are highly coercive and where they are located on the document of value. The security features made of highly coercive material are still pre-magnetized by the first pre-magnetization in the first direction and can be identified by the sensor line. The security features with a weakly coercive material or the combined security features are re-magnetized or cancel each other out. These security features cannot be identified directly by the second sensor line.

As a result of the comparison of the measurement result of the first sensor line and the measurement result of the second sensor line, it can be determined which security features on the document of value are made of a highly coercive material and which are made of a weakly coercive material. The measuring device is required to be very long in the travel direction of the document of value. In the majority of applications, in particular in cash dispensers, however, there is generally little space for a measuring device having a pre-magnetizing magnet and a double-line sensor line.

SUMMARY

A measuring device according to the invention comprises a sensor line and a pre-magnetizing magnet. The sensor line has at least one sensor and extends in a line direction. The pre-magnetizing magnet has a non-homogeneous magnetization.

BRIEF DESCRIPTION OF THE DRAWINGS

The invention will now be described by way of example with reference to the accompanying figures, of which.

DETAILED DESCRIPTION OF THE EMBODIMENTS

Figure 1:
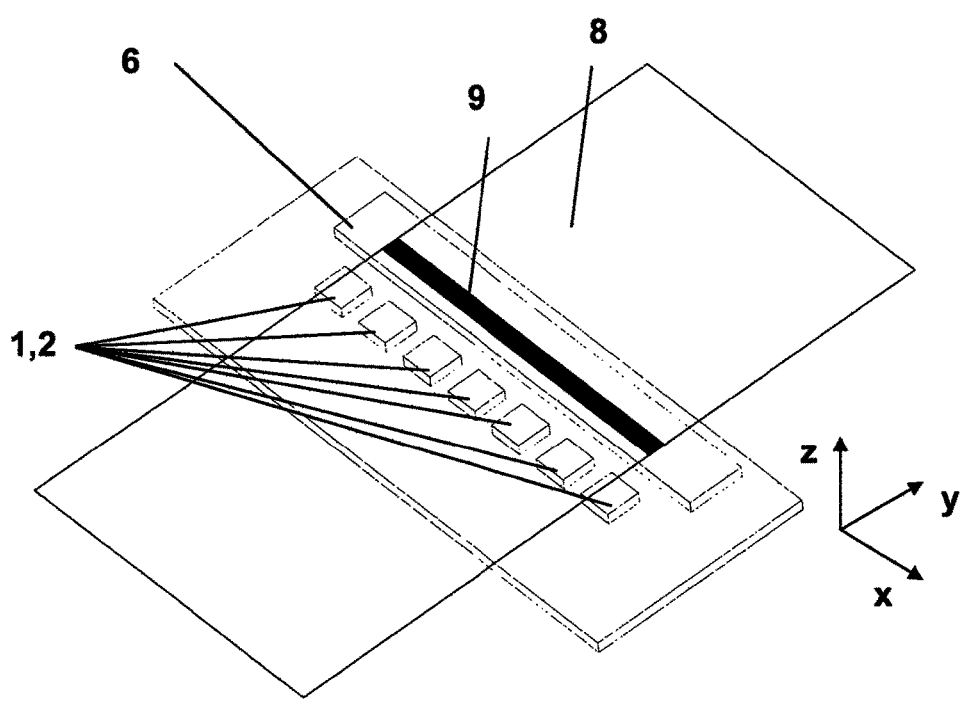
FIG. 1 is a perspective view of a measuring device according to an embodiment of the present invention.

Exemplary embodiments of the present invention will be described hereinafter in detail with reference to the attached drawings, wherein like reference numerals refer to like elements. The present invention may, however, be embodied in many different forms and should not be construed as being limited to the embodiments set forth herein. Rather, these embodiments are provided so that the present disclosure will be thorough and complete and will fully convey the concept of the disclosure to those skilled in the art.

Figure 2:
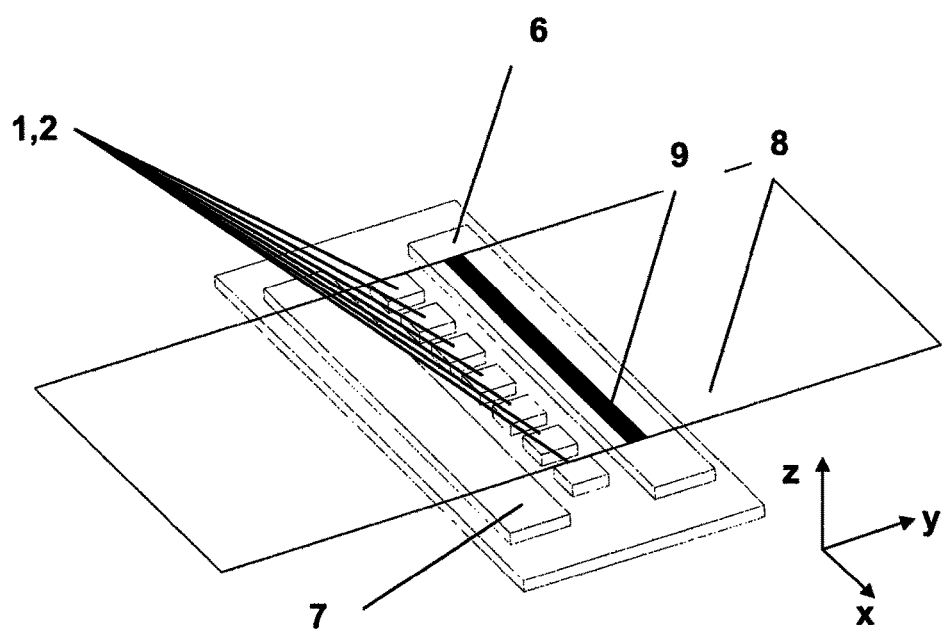
FIG. 2 is a perspective view of a measuring device according to another embodiment of the present invention.
Figure 3:
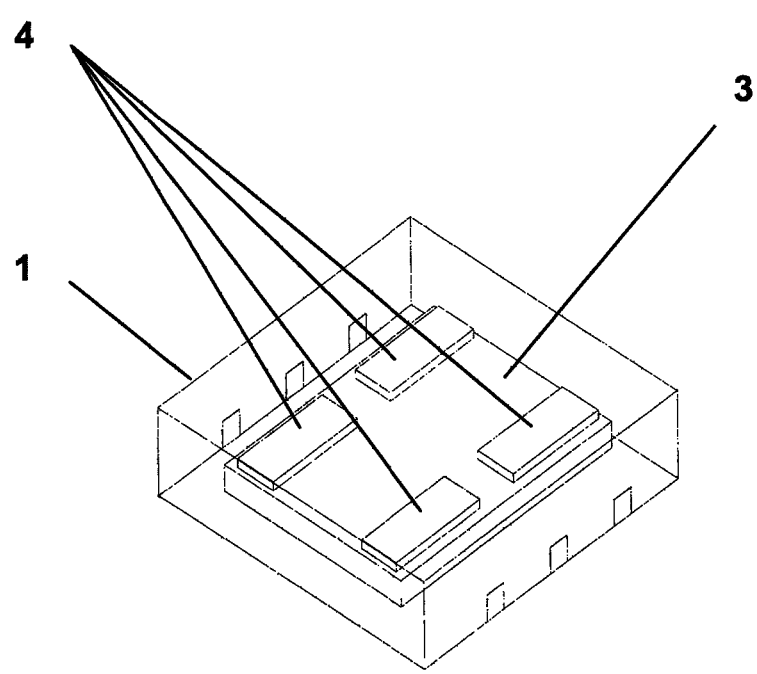
FIG. 3 is a perspective view of a sensor of the measuring device.

A measuring device for measuring magnetic properties according to the present invention is shown in FIGS. 1-3. The measuring device has a sensor line 2 having a plurality of sensors 1 and at least one pre-magnetizing magnet 6.

The sensors 1, as shown in FIG. 3, has a plurality of magnetoresistive bridge resistors 4 which are disposed on a substrate 3 and connected to form a Wheatstone bridge. The bridge resistors 4 have an Anisotropic Magnetoresistive ("AMR") effect. With this bridge connection, the sensors 1 can measure magnetic properties of an environment of the measuring device, in particular the change of the field strength of a field component in the environment.

The sensors 1, as shown in FIGS. 1 and 2, are arranged along the sensor line 2 in a line direction. In the shown embodiment, the sensor line 2 has seven sensors 1.

Figure 5:
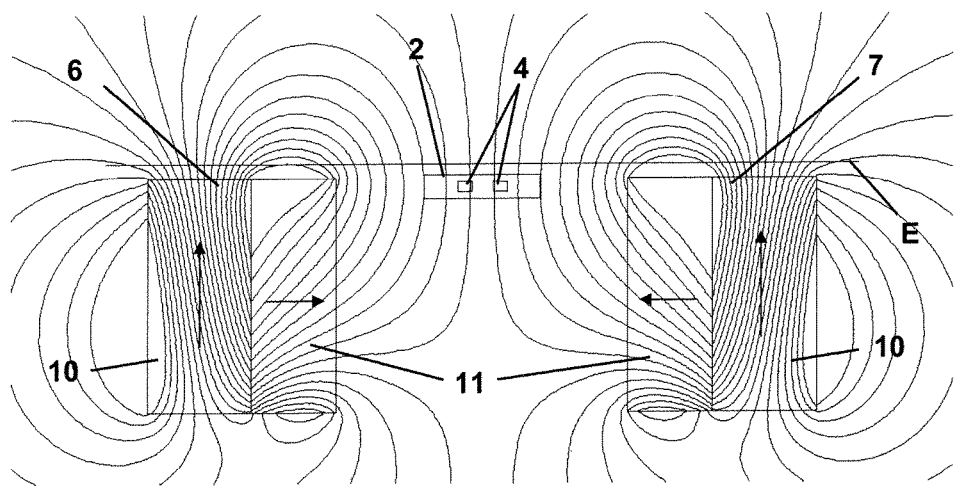
FIG. 5 is a schematic view of the measuring device of FIG. 2 with magnetic field lines produced by a pair of pre-magnetizing magnets.

The measuring device, as shown in FIGS. 1 and 5, has a support field device 5 producing a magnetic support field in the region in which the sensor line 2 extends. The support field device 5 is produced from plastics-bonded hard ferrite or rare earth magnets which have been injection-molded or pressed from sintered rare earth magnets or other permanent magnetic materials. In other embodiments, the support field device 5 has an arrangement of permanently magnetic magnets which are fitted onto a carrier plate in the non-magnetic state and are magnetized together afterwards.

The pre-magnetizing magnet 6 shown in FIG. 1 has a length in a longitudinal direction disposed parallel to the sensor line 2 and is spaced apart from the sensor line 2 in a direction perpendicular to the line direction. The embodiment shown in FIG. 2 includes a second pre-magnetizing magnet 7 disposed parallel to the sensor line 2, spaced apart from the sensor line 2 in a direction perpendicular to the line direction, and on an opposite side of the sensor line 2 from the pre-magnetizing magnet 6. Magnets containing isotropic hard ferrites and rare earths are used for the pre-magnetizing magnets 6, 7.

The measuring device, as shown in FIGS. 1 and 2, is used to measure magnetic properties of a document of value 8 having a security feature 9. In various embodiments, the document of value 8 is a bank note, a bank check, or a paper sheet.

Figure 4:
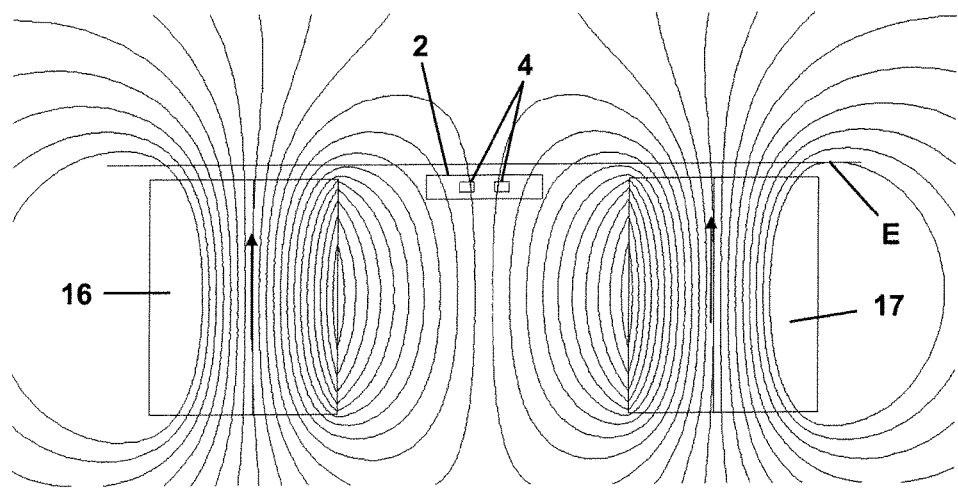
FIG. 4 is a schematic view of a measuring device according to the prior art with magnetic field lines produced by a pair of pre-magnetizing magnets.

A measuring device according to the prior art is shown in FIG. 4 and has a first pre-magnetizing magnet 16 disposed upstream of a sensor line 2 in the movement direction of the document of value 8 and a second pre-magnetizing magnet 17 disposed downstream of the sensor line 2 in the movement direction. The document of value 8 is guided through a plane E from left to right in FIG. 4. The pre-magnetizing magnets 16 and 17 have homogeneous magnetizations and are constructed as elongated block magnets. The magnetic field lines in FIG. 4 show the conventional peripheral deviations of the magnetic field lines occurring in the case of homogeneous magnetizations. The value of the magnetic field component pointing in the longitudinal direction of the pre-magnetizing magnets 16 and 17 is substantially zero.

The measuring device according to the invention shown in FIG. 2 is schematically shown in FIG. 5. The first pre-magnetizing magnet 6 is disposed upstream of the sensor line 2 in the movement direction of the document of value 8 and the second pre-magnetizing magnet 7 is disposed downstream of the sensor line 2 in the movement direction of the document of value 8. The pre-magnetizing magnets 6 and 7 have non-homogeneous magnetizations. Non-homogeneous magnetization is considered, for example, to be one in which the magnetization rotates from one surface of the pre-magnetizing magnet 6, 7 to the opposite surface of the pre-magnetizing magnet 6, 7 by more than 45°. In other embodiments, the magnetization can rotate by more than 90° or by more than 180°.

The pre-magnetizing magnets 6 and 7, as shown in FIG. 5, are produced in the manner of a Halbach array, in which segments of permanent magnets whose magnetization direction with respect to each other is tilted by 90° in the direction of the longitudinal axis of the array are disposed together, in that a first permanent magnet 10 having a homogeneous magnetization which points in a first direction is connected to a second permanent magnet 11 having a homogeneous magnetization which points in a second direction. The connection of the first permanent magnet 10 to the second permanent magnet 11 can be carried out by adhesive bonding. In other embodiments, the first permanent magnet 10 can be connected to the second permanent magnet 11 by embedding in a casting compound or pressing into a housing, a frame, or other form.

As a result of the connection of the first permanent magnet 10 to the second permanent magnet 11, there is provided a pre-magnetizing magnet 6, 7 whose magnetization rotates by approximately 90° over the extent thereof. The value of the magnetic field component pointing in the longitudinal direction of the pre-magnetizing magnets 6 and 7 is substantially zero. The magnetic field lines illustrated in FIG. 5 reproduce the magnetic field of the first pre-magnetizing magnet 6 which arises from the superimposition of the magnetic field of the first permanent magnet 10 and the second permanent magnet 11 or, more specifically, the magnetic field which is produced from the superimposition of the magnetic field produced by the first pre-magnetizing magnet 6 with the magnetic field produced by the second pre-magnetizing magnet 7.

Since the permanent magnets 10 and 11 each have a homogeneous magnetic field, the progression of the magnetization component of the magnetization of the first magnet 10 in the first direction is homogeneous and non-zero, the progression of the magnetization component of the magnetization of the first magnet 10 in the second direction is homogeneous and substantially zero, and the progression of the magnetization component of the magnetization of the first magnet 10 in the third direction is homogeneous and substantially zero. Similarly, the progression of the magnetization component of the magnetization of the second magnet 11 in the first direction is homogeneous and substantially zero, the progression of the magnetization component of the magnetization of the second magnet 11 in the second direction is homogeneous and non-zero, and the progression of the magnetization component of the magnetization of the second magnet 11 in the third direction is homogeneous and substantially zero. As a result, the progression of the magnetization component of the first magnet 10 in the first direction is different from the progression of the magnetization component of the second magnet 11 in the first direction, creating a non-homogeneous first component over an extent of the pre-magnetizing magnet 6, 7 in the first direction. The progression of the magnetization component of the first magnet 10 in the second direction is different from the progression of the magnetization component of the second magnet 11 in the second direction, creating a non-homogeneous second component over an extent of the pre-magnetizing magnet 6, 7 in the second direction. The progression of the magnetization component of the first magnet 10 in the third direction is identical to the progression of the magnetization component of the second magnet 11 in the third direction, creating a homogenous third component over an extent of the pre-magnetizing magnet 6, 7 in the third direction. The magnetization component is substantially zero in this third direction in both magnets.

The pre-magnetizing magnet 6, 7 has a length in the longitudinal direction, a height, and a width. The length of the pre-magnetizing magnet 6, 7 is greater than the height and the width of the pre-magnetizing magnet 6, 7. The first direction extends along the height of the pre-magnetizing magnet, the second direction extends along the width of the pre-magnetizing magnet, and the third direction extends along the length of the pre-magnetizing magnet.

FIG. 5 shows that the field lines of the magnetic field produced by the pre-magnetizing magnets 6 and 7 in the region of the bridge resistors 4 of the sensor line 2 extend substantially vertically and, therefore, perpendicularly to the line direction of the sensor line 2 and perpendicularly to the width of the sensor line 2. However, since a magnetic field is still present in the region of the plane E which is located immediately above the sensor line 2, magnetically soft structures on the document of value 8 can be magnetized with this magnetic field so that they can be identified by the sensor line 2. The same applies with respect to the magnetically soft structures in the embodiments of FIGS. 7, 9, 11, 13, 15 described below.

Figure 6:
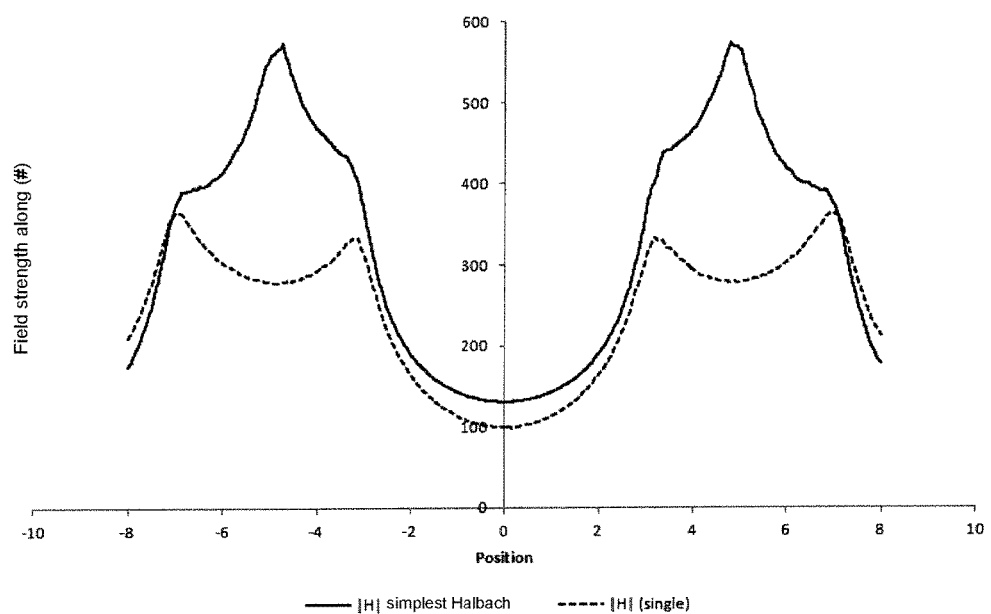
FIG. 6 is a graph of a field strength of the magnetic field produced by the pre-magnetizing magnets in the measuring devices of FIGS. 4 and 5.

The progression of the magnetic field strength along the path in the plane E, along which the document of value 8 is guided through the measuring device, is shown in FIG. 6. The magnetic field strength of the magnetic field produced by the pre-magnetizing magnets 6 and 7 of the measuring device according to FIG. 5 is shown as a solid line. The magnetic field strength of the magnetic field produced by the pre-magnetizing magnets 16 and 17 of the measuring device according to FIG. 4 is shown as a dashed line. Both magnetic fields have the same dimension, that is to say, the same magnet volume. It can be seen that the maximum field strength of the pre-magnetizing field which is produced in the device according to the present invention can be almost doubled with respect to that of a conventional block magnet.

Figure 7:
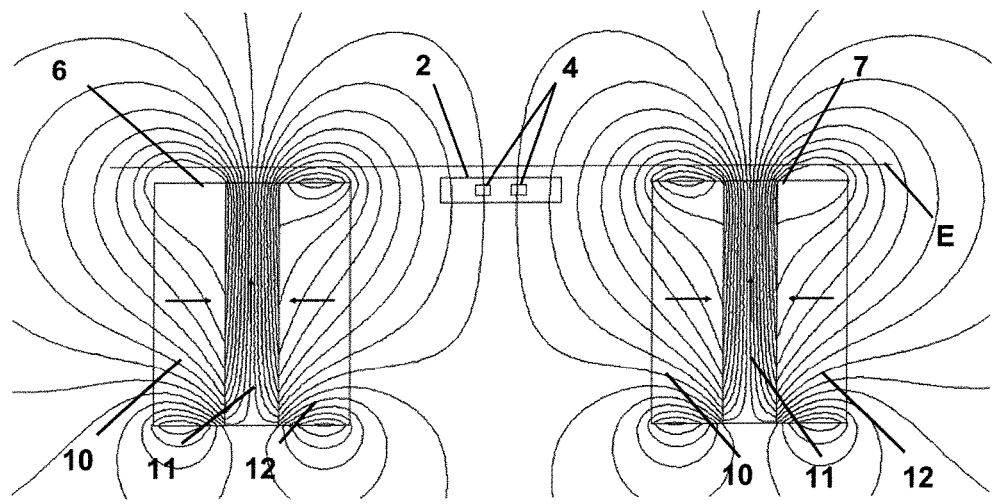
FIG. 7 is a schematic view of a measuring device according to another embodiment of the present invention with magnetic field lines produced by a pair of pre-magnetizing magnets.
Figure 8:
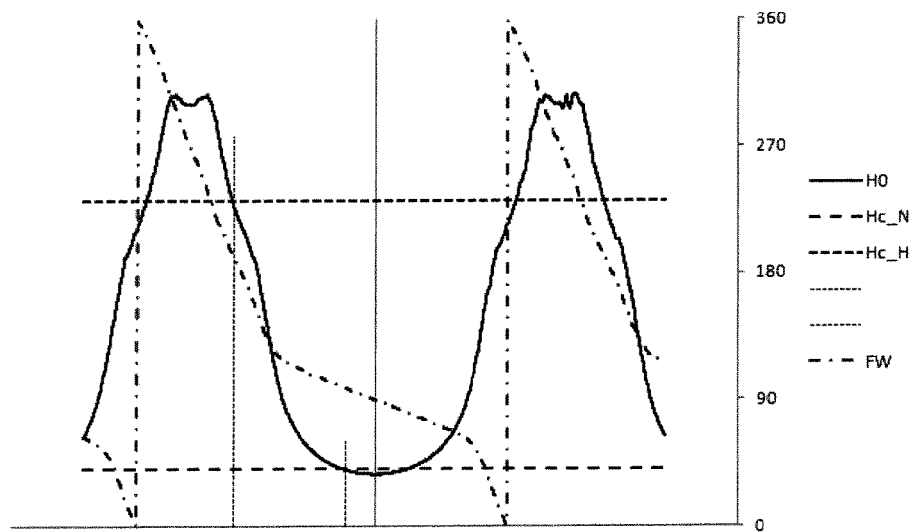
FIG. 8 is a graph of a field strength of the magnetic field produced by the pre-magnetizing magnets in the measuring device of FIG. 7.

A measuring device according to another embodiment of the present invention is shown in FIGS. 7 and 8. Like reference numbers indicate like elements, and only the differences from the embodiment of FIGS. 1-3, 5, and 6 will be described herein.

The measuring device shown in FIG. 7 differs from that shown in FIG. 5 in that the pre-magnetizing magnets 6 and 7 are each formed by joining together a total of three permanent magnets 10, 11, 12 each with homogeneous magnetizations pointing in different directions.

FIG. 8 shows the progression of the amount of the magnetic field strength along the path in the plane E. The magnetic field strength of the magnetic field produced by the pre-magnetizing magnets 6 and 7 of the measuring device according to FIG. 7 is shown as a solid line HO. The coercive field strength of a weakly coercive magnetic material on the document of value 8 is shown as an interrupted line HC N. The coercive field strength of a highly coercive magnetic material on the document of value 8 is shown as a less substantially interrupted line HC H. The thin, broken, vertically extending lines show the point along the path in the plane E at which the amount of the magnetic field intersects with the coercive field strength of the weakly coercive or highly coercive magnetic material. At these points, the magnetic material on the document of value 8 has a magnetization which points in a direction the magnetic field had at the time the magnetic field intersects with the coercive field strength of the weakly coercive or highly coercive magnetic material.

FIG. 8 shows, as a dot-dash line FW, the progression of the field angle of the magnetic field which is produced by the pre-magnetizing magnets 6 and 7 along the path in the plane E. The scale provided in the graph of FIG. 8 on the right-hand side indicates the angle. The points at which the thin broken lines intersect the dot-dash line FW indicate the field angles at which the magnetic material obtains the direction of magnetization. It can be seen that the magnetic field in the weakly coercive magnetic material points in a direction different from the one in the highly coercive material; in the weakly coercive material, the angle is approximately 90° and in the highly coercive material slightly above 180°. The magnetization of the weakly coercive material thus points in a direction different by approximately 90° with respect to the magnetization of the highly coercive material.

These magnetizations of the magnetic materials which are different by 90° can be detected by the sensor line 2 by evaluating the signal progressions. If a security feature 9, shown in FIGS. 1 and 2, made of the highly coercive material and a security feature 9 made of the weakly coercive material are provided on the document of value 8, the sensor line 2 can identify the presence thereof and the location thereof along the sensor line 2. Since the sensor line 2 can identify the different direction of the magnetization, the sensor line 2 can also identify whether a security feature 9 made of highly coercive material or a security feature 9 made of weakly coercive material is present at the location.

There are also known documents of value 8 which have a security feature 9 which is produced from highly coercive material and weakly coercive material. In these security features 9, highly coercive material is provided directly adjacent to the weakly coercive material. The magnetization of the two magnetic materials which form the security feature is carried out in the same manner. The magnetization of the highly coercive material stops at one point along the path of the document of value 8 and obtains the magnetization direction prevailing at this time (slightly above 180° in the example of FIGS. 7 and 8). The magnetization of the weakly coercive material stops at the other point along the path of the documents of value 8 along the plane E and obtains the magnetization direction prevailing at this time (approximately 90° in the example of FIGS. 7 and 8). Since the directions of the magnetizations of the magnetic materials produced in this manner are oriented only at approximately 90° and not, for example, at 180° relative to each other, the magnetizations do not cancel each other out. The security feature formed from the two magnetic materials obtains a total magnetization with a value and a magnetization direction which can be identified by the sensor line 2. As a result, the measuring device according to the invention can also identify security features 9 which are produced from highly coercive material and weakly coercive material.

Figure 9:
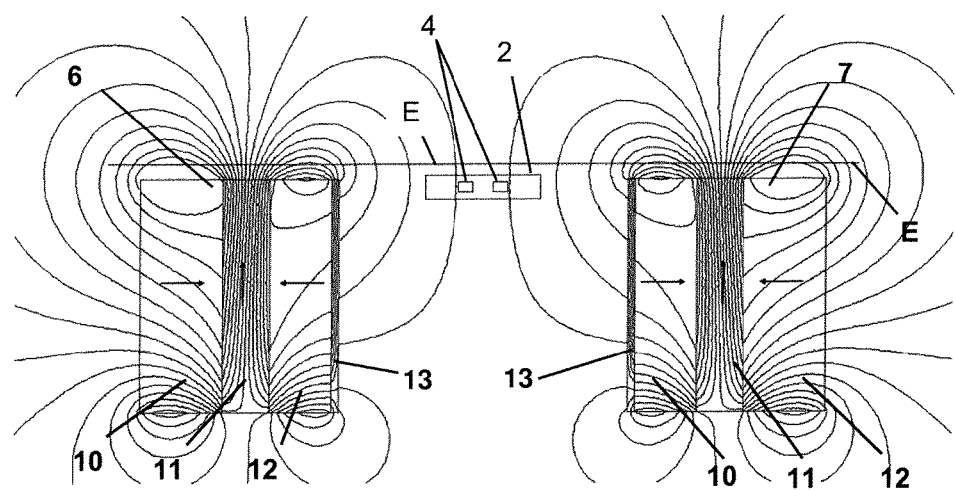
FIG. 9 is a schematic view of a measuring device according to another embodiment of the present invention with magnetic field lines produced by a pair of pre-magnetizing magnets.
Figure 10:
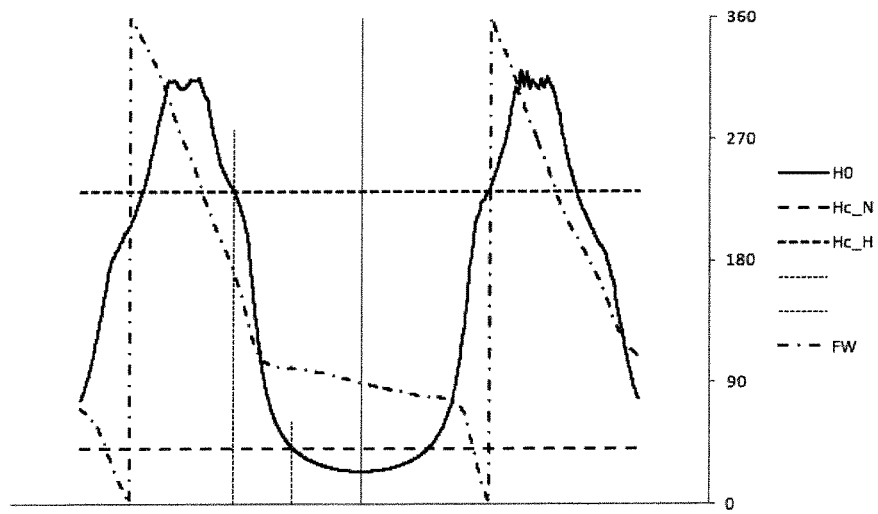
FIG. 10 is a graph of a field strength of the magnetic field produced by the pre-magnetizing magnets in the measuring device of FIG. 9.

A measuring device according to another embodiment of the present invention is shown in FIGS. 9 and 10. Like reference numbers indicate like elements and only differences from the embodiment of FIGS. 7 and 8 will be described herein. The measuring device shown in FIG. 9 differs from that shown in FIG. 7 in that the pre-magnetizing magnets 6 and 7 further have a plate 13 in addition to the total of three permanent magnets 10, 11, 12. The plate 13 shields the sensor line 2 slightly from the magnetic field which is produced by the pre-magnetizing magnets 6 and 7, as can be seen from a comparison of FIG. 7 with FIG. 9, from the progression of the field lines and the field line density. The plate 13 is formed of a ferromagnetic material with a high level of permeability and a high level of saturation flux density, such as, for example, iron or construction steel.

Figure 11:
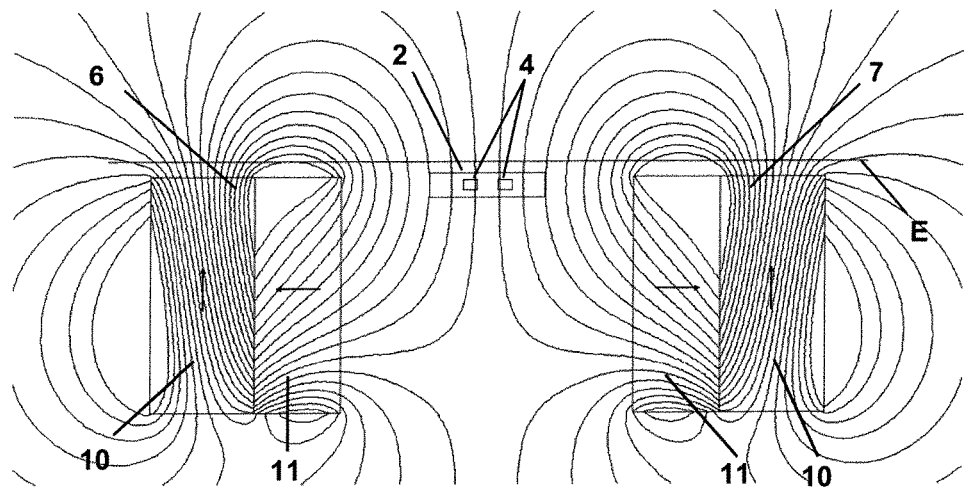
FIG. 11 is a schematic view of a measuring device according to another embodiment of the present invention with magnetic field lines produced by a pair of pre-magnetizing magnets.
Figure 12:
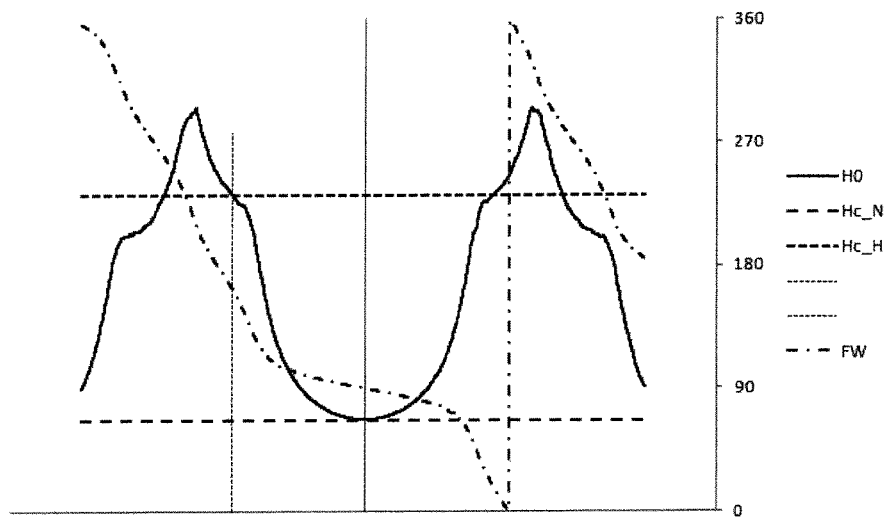
FIG. 12 is a graph of a field strength of the magnetic field produced by the pre-magnetizing magnets in the measuring device of FIG. 11.

A measuring device according to another embodiment of the present invention shown in FIGS. 11 and 12 differs from the embodiment of FIG. 5 in that the magnet 11 has a different magnetization direction. FIG. 12 shows the progression of the field strength and of the field angle, which evaluation can be compared with FIGS. 10 and 8, and the points at which the magnetization of the highly coercive material or the weakly coercive material is fixed as described above.

Figure 13:
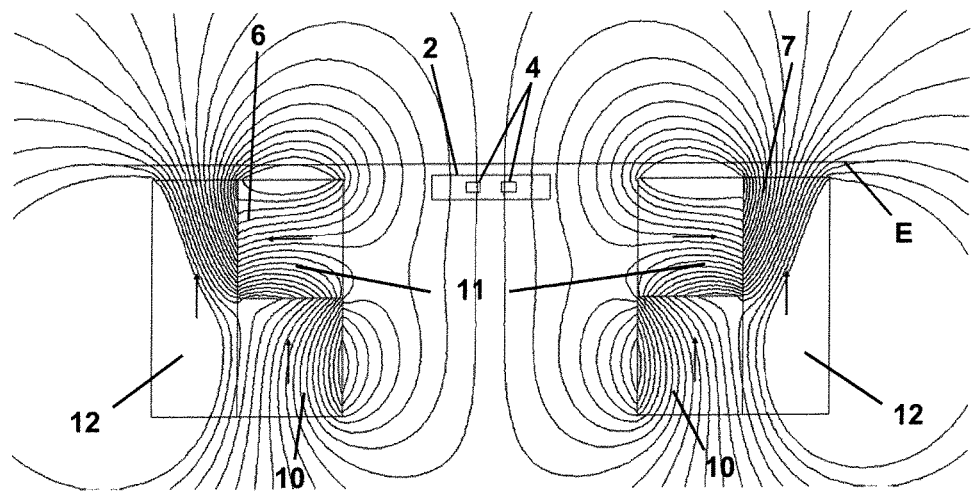
FIG. 13 is a schematic view of a measuring device according to another embodiment of the present invention with magnetic field lines produced by a pair of pre-magnetizing magnets.
Figure 14:
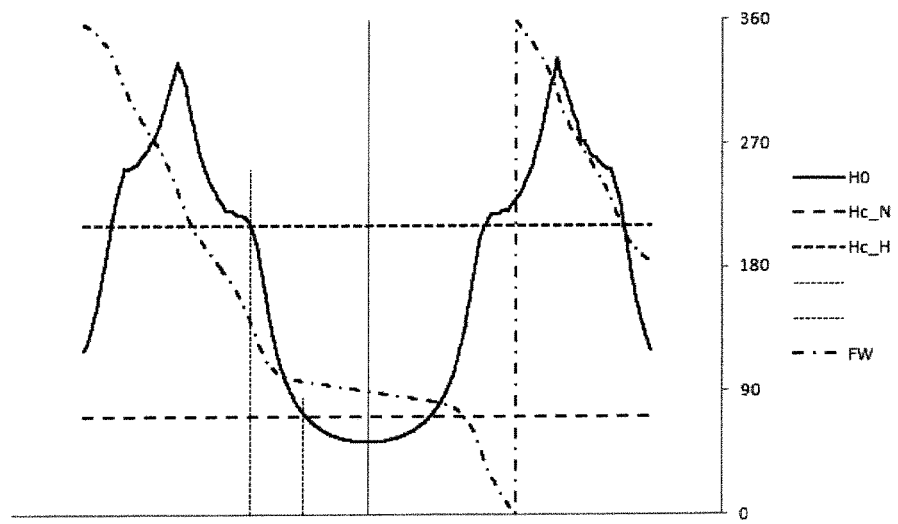
FIG. 14 is a graph of a field strength of the magnetic field produced by the pre-magnetizing magnets in the measuring device of FIG. 13.

A measuring device according to another embodiment of the present invention shown in FIGS. 13 and 14 differs from the previously described embodiments through the structure of the pre-magnetizing magnets 6, 7. In the measuring device of FIG. 13, the three permanent magnets 10, 11, 12 are arranged differently than in the embodiment of FIG. 9. FIG. 14 shows the evaluation of the progression of the field strength and of the field angle, which evaluation can be compared with FIGS. 10 and 8, and the points at which the magnetization of the highly coercive material or the weakly coercive material is fixed as described above.

Figure 15:
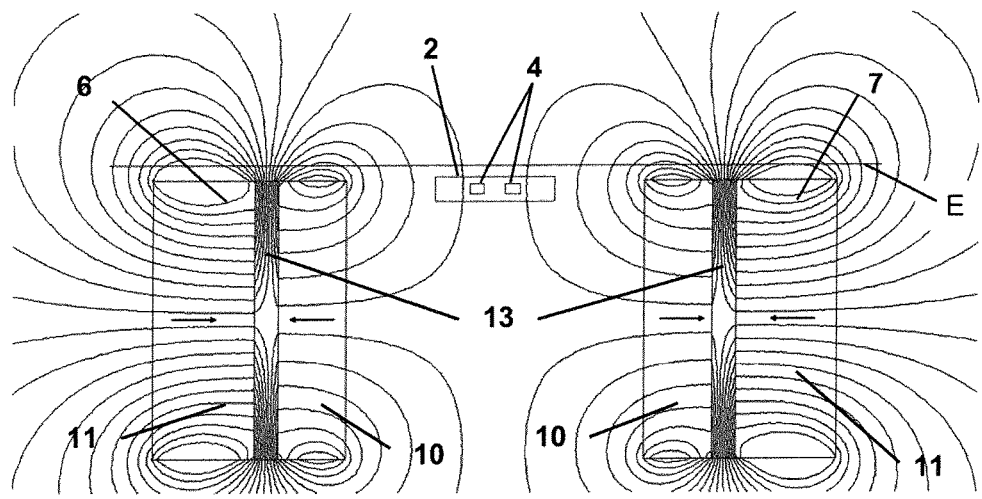
FIG. 15 is a schematic view of a measuring device according to another embodiment of the present invention with magnetic field lines produced by a pair of pre-magnetizing magnets.
Figure 16:
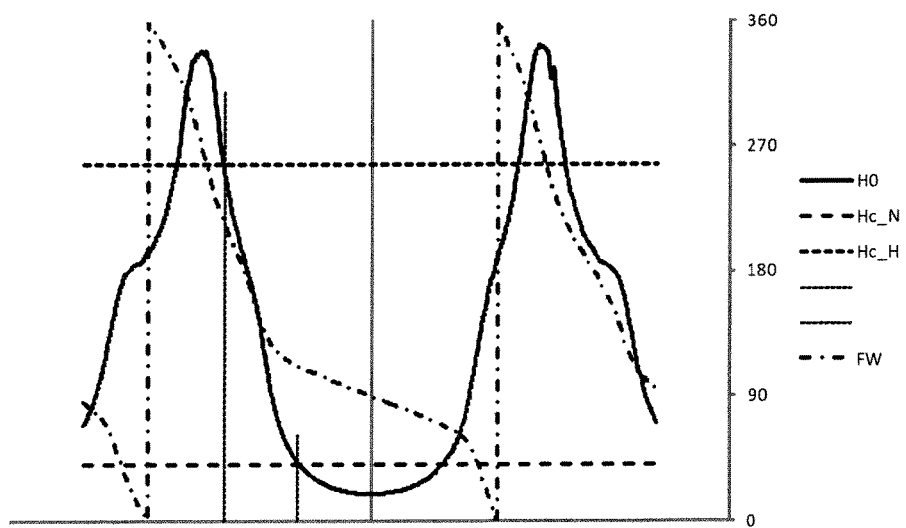
FIG. 16 is a graph of a field strength of the magnetic field produced by the pre-magnetizing magnets in the measuring device of FIG. 15.

A measuring device according to another embodiment of the present invention shown in FIGS. 15 and 16 differs from the previously described embodiments through the structure of the pre-magnetizing magnets 6, 7. The pre-magnetizing magnets 6, 7 in the embodiment of FIG. 15 each have two permanent magnets 10, 11 having different homogeneous magnetization, the magnetization direction of which differs by 180°. A plate 13 is disposed between the permanent magnets 10, 11 which form the pre-magnetizing magnets 6, 7 and guides the flow of the magnetic flux. FIG. 16 shows the evaluation of the progression of the field strength and of the field angle, which evaluation can be compared with FIGS. 10 and 8, and the points at which the magnetization of the highly coercive material or the weakly coercive material is fixed as described above.

Figure 17:
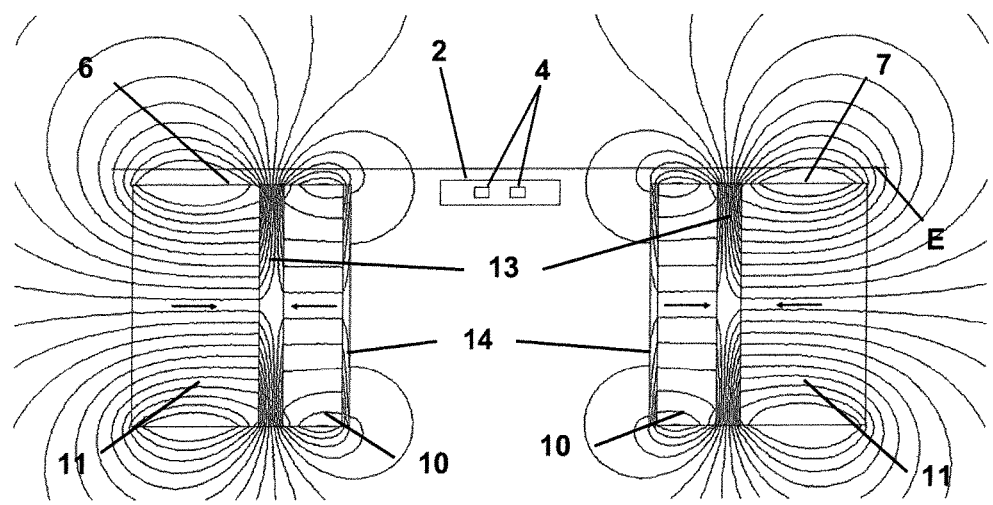
FIG. 17 is a schematic view of a measuring device according to another embodiment of the present invention with magnetic field lines produced by a pair of pre-magnetizing magnets.
Figure 18:
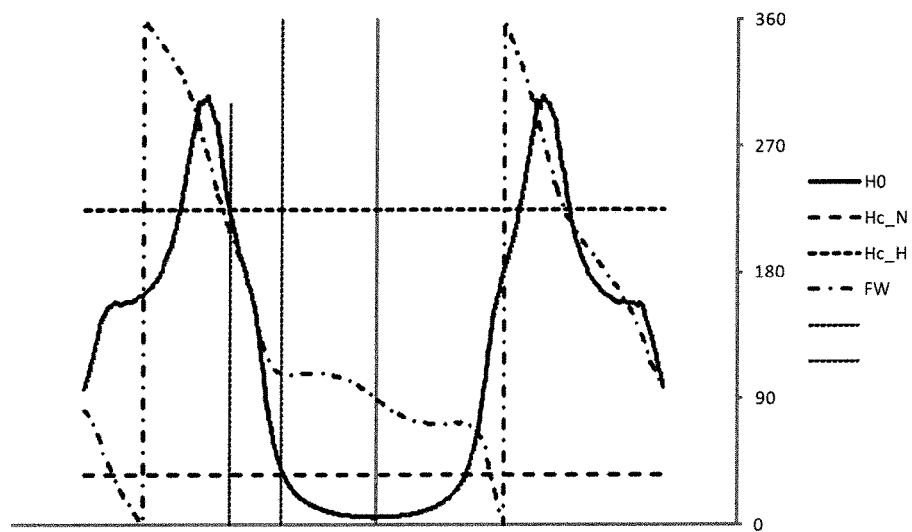
FIG. 18 is a graph of a field strength of the magnetic field produced by the pre-magnetizing magnets in the measuring device of FIG. 17.

A measuring device according to another embodiment of the present invention, shown in FIGS. 17 and 18, differs from that shown in FIG. 15 in that another plate 14 is disposed at the edge of the pre-magnetizing magnets 6 and 7 and shields the sensor line 2 so that only a very small field remains on the sensor. FIG. 18 shows the evaluation of the progression of the field strength and of the field angle, which evaluation can be compared with FIGS. 10 and 8, and the points at which the magnetization of the highly coercive material or the weakly coercive material is fixed as described above.

Figure 19:
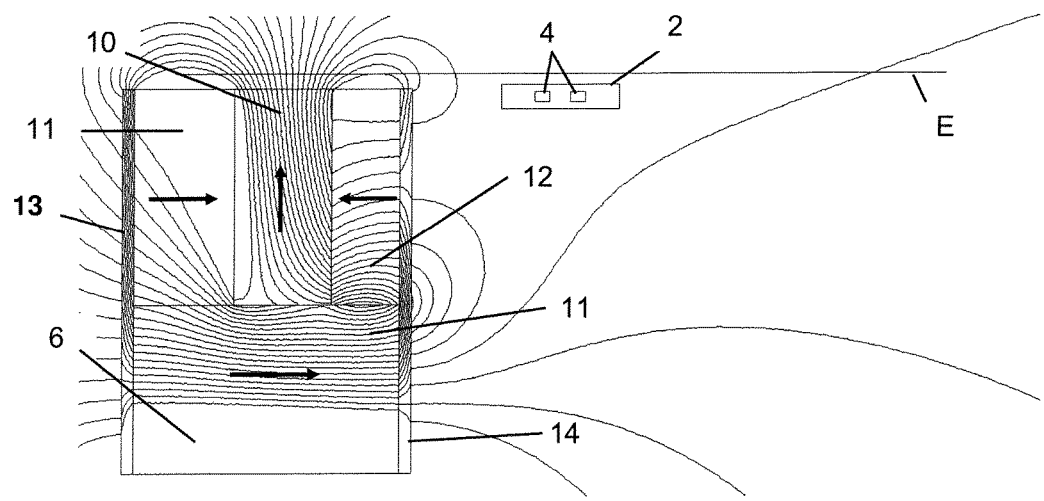
FIG. 19 is a schematic view of a measuring device according to another embodiment of the present invention with magnetic field lines produced by one pre-magnetizing magnet.
Figure 20:
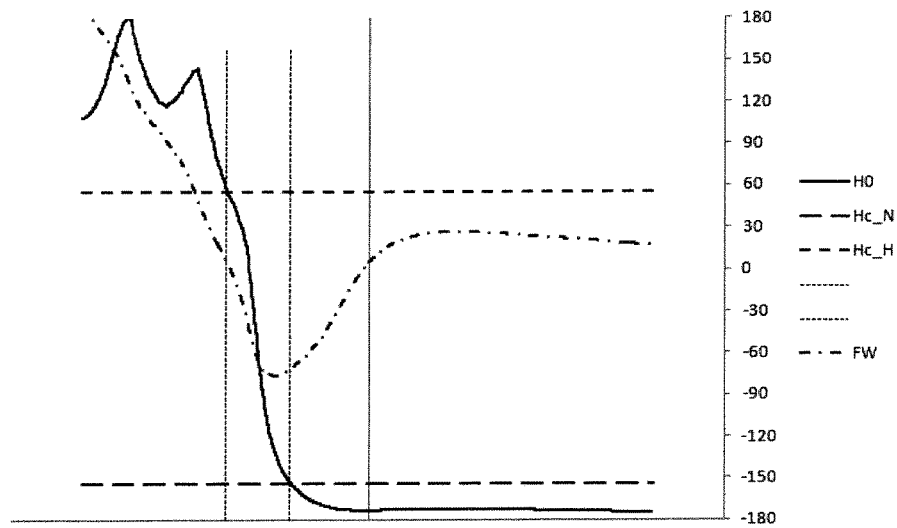
FIG. 20 is a graph of a field strength of the magnetic field produced by the pre-magnetizing magnet in the measuring device of FIG. 19.

A measuring device according to another embodiment of the present invention, shown in FIGS. 19 and 20, has only one pre-magnetizing magnet 6, similar to the embodiment of FIG. 1. The measuring device of FIG. 19 has three permanent magnets 10, 11, 12, each having a magnetization which is homogeneous but oriented differently relative to each other and plates 13, 14 which are provided at the edge sides. The pre-magnetizing magnet 6 is constructed in such a manner that the field on the right side falls to zero practically immediately in order to keep the spatial requirement as small as possible. Since the magnetic field of the pre-magnetizing magnet 6 falls practically to zero at the right edge thereof, the pre-magnetizing magnet 6 can be arranged immediately adjacent to the sensor line 2 without any risk that the pre-magnetizing magnetic field may disrupt the measurement value recording of the sensor line 2 or may disrupt a support field of the sensor line 2. FIG. 20 shows the evaluation of the progression of the field strength and of the field angle, which evaluation can be compared with FIGS. 10 and 8, and the points at which the magnetization of the highly coercive material or the weakly coercive material is fixed as described above.

Figure 21:
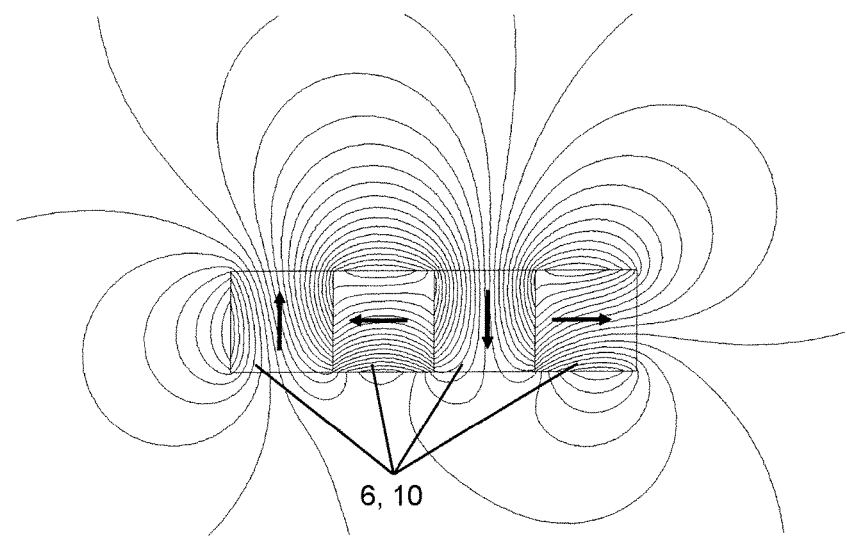
FIG. 21 is a schematic view of a measuring device according to another embodiment of the present invention with magnetic field lines produced by one pre-magnetizing magnet.
Figure 22:
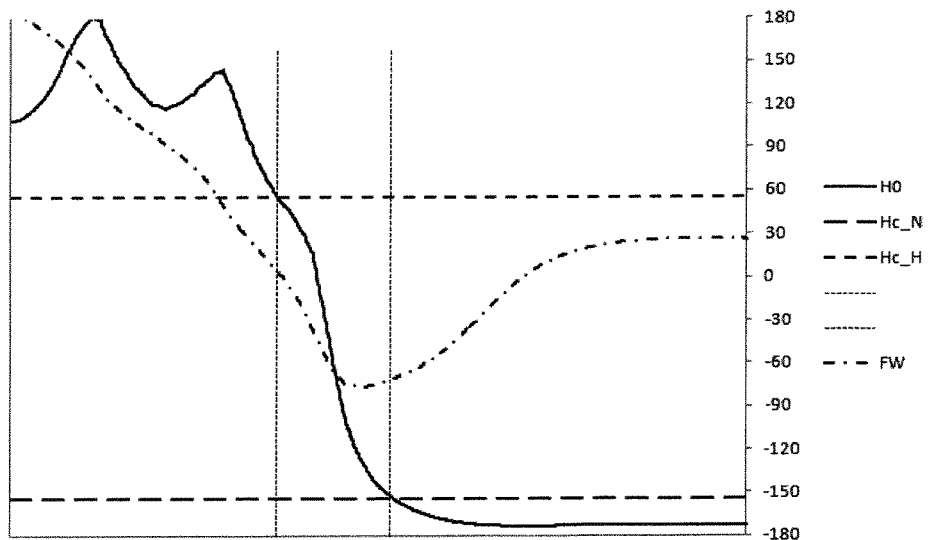
FIG. 22 is a graph of a field strength of the magnetic field produced by the pre-magnetizing magnet in the measuring device of FIG. 21.

A measuring device according to another embodiment of the present invention, shown in FIGS. 21 and 22 has only one pre-magnetizing magnet 6. The measuring device has four permanent magnets 10 each having a magnetization which is homogeneous but oriented differently relative to each other. The pre-magnetizing magnet 6 is constructed in such a manner that the dipole moments of the individual components are oriented in opposite directions and, therefore, cancel each other out in total. This embodiment thereby produces only multipole fields of a higher order. Such fields fall towards zero far more quickly with increasing spacing than in a dipole field. On the one hand, the field strength at close range is thereby increased and, on the other hand, smaller spacings from the adjacent measuring device are possible. FIG. 22 shows the evaluation of the progression of the field strength and of the field angle, which evaluation can be compared with FIGS. 10 and 8, and the points at which the magnetization of the highly coercive material or the weakly coercive material is fixed as described above.

Figure 23:
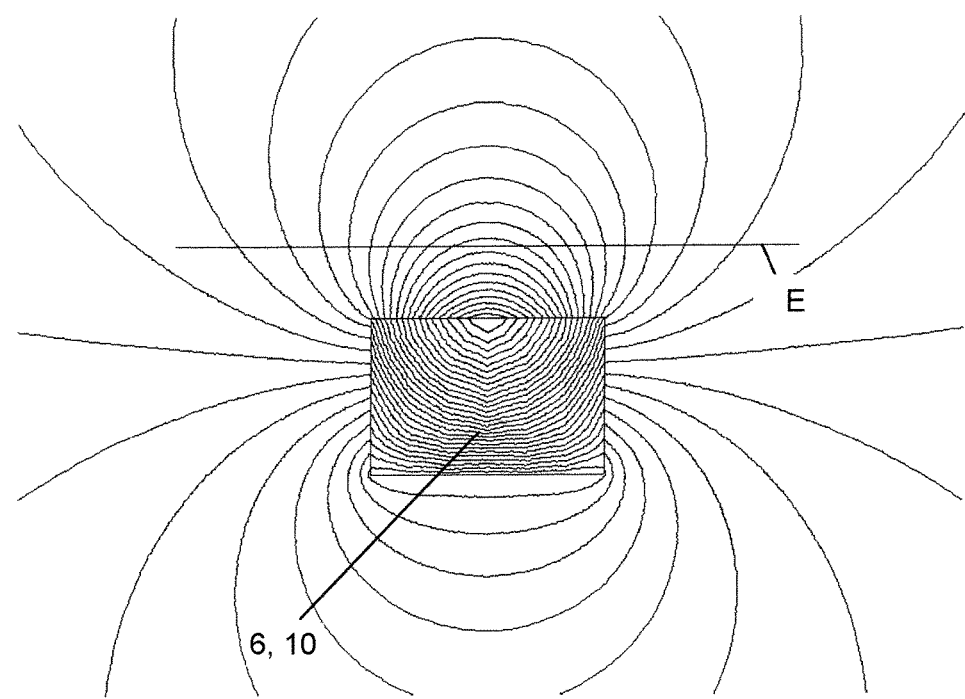
FIG. 23 is a schematic view of a measuring device according to another embodiment of the present invention with magnetic field lines produced by one pre-magnetizing magnet.

A measuring device according to another embodiment of the present invention is shown in FIG. 23. The measuring device has only one pre-magnetizing magnet 6 including a single permanent magnet 10. The permanent magnet 10 has inhomogeneous magnetization, which results in a one-sided field concentration.

Figure 24:
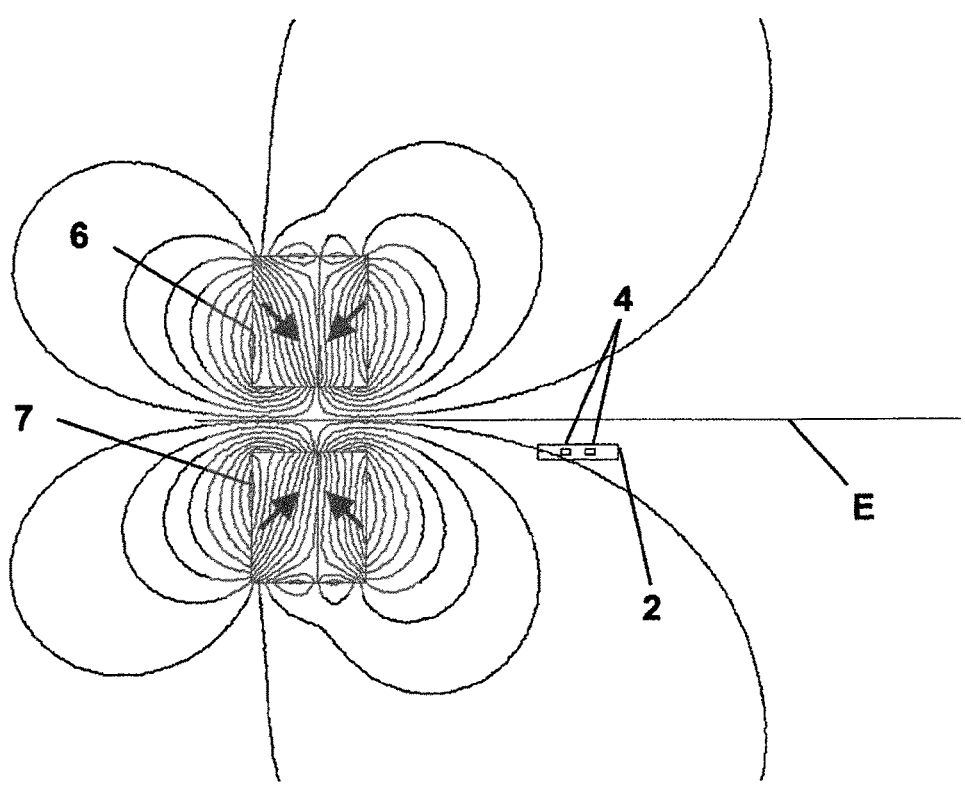
FIG. 24 is a schematic view of a measuring device according to another embodiment of the present invention with magnetic field lines produced by a pair of pre-magnetizing magnets.

A measuring device according to another embodiment is shown in FIG. 24. The two pre-magnetizing magnets 6, 7 are disposed one above the other and the plane E extends between the two pre-magnetizing magnets 6, 7. The pre-magnetizing magnets 6 and 7 are disposed upstream of the sensor line 2 in the movement direction of the document of value 8. The pre-magnetizing magnets 6 and 7 are produced in the manner of a Halbach array in that a first permanent magnet 6 having a homogeneous magnetization which points in a first direction is connected to a second permanent magnet 7 having a homogeneous magnetization which points in a second direction. As a result, a pre-magnetizing magnet 6, 7 is created whose magnetization is rotated over the extent of the solid member thereof.

What is claimed is:

1. A measuring device, comprising:
   a sensor line having at least one sensor to measure magnetic properties and extending in a line direction; and
   a first pre-magnetizing magnet having a non-homogeneous magnetization.

2. The measuring device of claim 1, wherein the first pre-magnetizing magnet has a length greater than a height and a width of the first pre-magnetizing magnet, the length of the first pre-magnetizing magnet extending parallel to the line direction.

3. The measuring device of claim 1, further comprising a second pre-magnetizing magnet disposed on an opposite side of the sensor line from the first pre-magnetizing magnet.

4. The measuring device of claim 3, wherein the sensor is capable of measuring a magnetic property only in a plane and a superimposition of a magnetic field produced by the first pre-magnetizing magnet and the second pre-magnetizing magnet has a first component pointing in the line direction and a second component pointing perpendicular to the line direction, the first component and the second component extending along the plane, the first component greater than the second component at least at a location of the sensor line.

5. The measuring device of claim 1, wherein the sensor is capable of measuring a magnetic property only in a plane and a superimposition of a magnetic field produced by the first pre-magnetizing magnet has a first component pointing in the line direction and a second component pointing perpendicular to the line direction, the first component and the second component extending along the plane, the first component greater than the second component at least at a location of the sensor line.

6. A method, comprising:
   (a) providing a measurement object having a first magnetic material with a first coercive field strength and a second magnetic material with a second coercive field strength less than the first coercive field strength;
   (b) pre-magnetizing the first magnetic material and the second magnetic material with a pre-magnetizing magnet at a first point, a second point, and a third point along a path of movement of the measurement object, a field strength of a pre-magnetizing field generated by the pre-magnetizing magnet is
      (1) greater than the first coercive field strength and greater than the second coercive field strength at the first point, (2) greater than the second coercive field strength at the second point, a field direction of the pre-magnetizing field pointing in a first direction at the second point,
(3) less than the first coercive field strength after leaving the second point, and
(4) less than the second coercive field strength at the third point, the field direction of the pre-magnetizing field pointing in a second direction different from the first direction at the third point; and (c) measuring magnetic properties of the measurement object at a sensor line of a measuring device positioned after the third point along the path of movement of the measurement object.

7. The method of claim 6, wherein the pre-magnetizing magnet has a non-homogeneous magnetization.

\* \* \* \* \*